United States Patent [19]

Chan et al.

[11] Patent Number: 5,578,226
[45] Date of Patent: Nov. 26, 1996

[54] MULTI-LAYERED SUPERCONDUCTIVE INTERCONNECTS

[75] Inventors: Hugo W. Chan; Arnold H. Silver, both of Rancho Palos Verdes, Calif.

[73] Assignee: TRW Inc., Redondo Beach, Calif.

[21] Appl. No.: 503,682

[22] Filed: Jul. 18, 1995

[51] Int. Cl.$^6$ .................................................. B44C 1/22
[52] U.S. Cl. ............................ 216/33; 216/88; 216/101; 505/410; 505/820
[58] Field of Search ................................. 216/33, 89, 38, 216/90, 52, 101, 88; 156/636.1, 645.1; 505/330, 410, 728, 816, 820

[56] References Cited

U.S. PATENT DOCUMENTS

| | | |
|---|---|---|
| 4,316,785 | 2/1982 | Suzuki et al. . |
| 4,916,114 | 4/1990 | Hoenig . |
| 4,954,480 | 9/1990 | Imanaka et al. . |
| 4,956,335 | 9/1990 | Agostinelli et al. . |
| 5,102,862 | 4/1992 | Okabe et al. . |
| 5,132,283 | 7/1992 | McCune . |
| 5,214,347 | 5/1993 | Gray . |
| 5,229,360 | 7/1993 | Shiga et al. . |
| 5,246,782 | 9/1993 | Kennedy et al. . |
| 5,247,189 | 9/1993 | Tanaka et al. . |
| 5,280,013 | 1/1994 | Newman et al. . |
| 5,286,336 | 2/1994 | Chan et al. . |

*Primary Examiner*—William Powell
*Attorney, Agent, or Firm*—Michael S. Yatsko

[57] ABSTRACT

A multi-layer superconductive interconnect structure includes a first multi-layer substrate with a first superconducting layer (SL) deposited on a first epitaxial substrate and a first glue dielectric layer (GDL) on the first SL. A second multi-layer substrate includes a second SL deposited on a second epitaxial substrate and a second GDL on said second SL. The first GDL and the second GDL are clamped and cured together to form a composite substrate.

26 Claims, 2 Drawing Sheets

MULTI-LAYERED SUPERCONDUCTIVE INTERCONNECTS

BACKGROUND OF THE INVENTION

1. Technical Field

This invention relates to multi-layer superconductive substrates and, more particularly, to fabricating multi-layered superconductive interconnects for superconductive multi-chip modules, printed circuit boards and other applications.

2. Discussion

Multi-chip modules typically include multiple integrated circuits mounted on a printed-circuit board. Each integrated circuit is typically connected to one or more of the other integrated circuits on the printed-circuit board, and, thus, interconnections or interconnects between the integrated circuits are required. The number of interconnect layers required depends upon the number of integrated circuits and connections therebetween.

Conventional nonsuperconductive interconnects have several performance drawbacks when used in electronic circuits such as multi-chip modules. For example, their direct current (DC) resistance and alternating current (AC) losses tend to increase the power required to operate the electronic circuits. Their relatively low current carrying capacity increases the number of interconnect lines or layers required to carry a given current than would be required for interconnects with higher current carrying capacities. Due to their DC resistance characteristics, conventional nonsuperconductive interconnects also experience electron migration which degrades interconnect lines, reduces current carrying capacity and eventually may cause open circuits.

Conventional superconductive interconnects alleviate most of the drawbacks of the nonsuperconductive interconnects. Conventional superconductive interconnects have no DC resistance and low AC loss. Conventional superconductive interconnect lines carry higher current than conventional nonsuperconductive (or metal) lines having the same physical dimensions at both room temperature and at cryogenic operating ambient temperatures. Conventional superconductive interconnects also have lower power consumption and electron migration problems. As a result of increased current carrying capacity, superconductive multi-layered interconnects have increased durability and employ fewer interconnect layers than conventional nonsuperconductive interconnects.

While the use of superconducting multi-layer interconnects is desirable, conventional methods of fabricating superconducting interconnects have several drawbacks. Fabrication of conventional superconductive multi-layered interconnects typically involves a standard integrated circuit (IC) process approach in which a first superconducting layer is deposited on a substrate. A dielectric layer is then deposited on the first superconducting layer. Via contacts are patterned if required. A second superconducting layer is thereafter deposited and patterned on the dielectric layer. This process is repeated to increase interconnect layers if required. Additional interconnect layers may be required depending upon the number of integrated circuits and required connections therebetween.

Significant problems are associated with the conventional methods of fabricating superconductive multi-layered interconnects. Forming a crystalline layer over nonplanar surfaces (often referred to as "steps") is far more difficult than forming a crystalline layer on a planar surface. Therefore, it is difficult to deposit an epitaxial dielectric layer with a low dielectric constant on a first superconducting layer which includes steps. The nonplanarity of the step disrupts grain growth. Current density is significantly reduced for superconducting layers crossing over nonplanar steps primarily due to grain boundaries. Still other problems include the tendency of the second superconducting layer to fill pinholes in the first dielectric layer which can cause a short circuit between the first and second superconducting layers.

Conventional superconductive multi-layered interconnects become even more nonplanar as additional interconnect layers are added. As a result, it becomes even more difficult to deposit high quality superconducting layers on the underlying dielectric layer.

Therefore, a superconductive interconnect having dielectric layers with a low dielectric constant, high quality/yield superconducting layers with high current density, and a maximum number of planar layers is desirable.

SUMMARY OF THE INVENTION

A multi-layer superconductive interconnect structure according to the invention includes a first multi-layer substrate with a first glue dielectric layer (GDL). A second multi-layer substrate is fabricated with a second GDL. The first and second multi-layer substrates are connected together with said first GDL and said second GDL in contact. The first and second multi-layer substrates are cured to create a first composite substrate.

According to a first embodiment of the invention, a first dielectric may be thinned to a desired thickness using a lapping/chemical-mechanical polishing technique. A via is then formed in the first substrate by ion milling, or reactive ion etching, or wet chemical etching. A third superconducting layer (SL) is deposited on the first substrate and a metal layer is deposited on the third SL.

According to a second embodiment of the invention, another fabrication method can be employed for materials sensitive to high temperatures encountered during high temperature (HT)SL deposition. Instead of depositing additional HTSL layers as in the first embodiment, a via is etched in the first substrate to expose the first SL and is filled with metal. A third multi-layered substrate is fabricated by depositing a third SL on a third substrate. A third GDL is deposited on at least one of the third SL and the thinned first substrate. The third multi-layered substrate and the first composite substrate are connected together with the third GDL between the third SL and the thinned first substrate. Electrical contact between the first SL and third SL is made through the via. The third multi-layered substrate and the first composite substrate are cured together to create a second composite substrate. The third substrate is then thinned using a lapping/polishing technique. A via is etched in the third substrate and a metal pad is deposited in the via.

Other objects, features and advantages will be readily apparent.

BRIEF DESCRIPTION OF THE DRAWINGS

The various advantages of the present invention will become apparent to those skilled in the an after studying the following specification and by reference to the drawings in which.

DETAILED DESCRIPTION

While the foregoing description illustrates a multi-layered high temperature superconducting (HTS) interconnects for a HTS multi-chip-module (MCM), skilled artisans can appreciate that the inventive concept can be applied to low temperature superconductor (LTS) MCM, interconnects and to other circuits.

Figure 1:
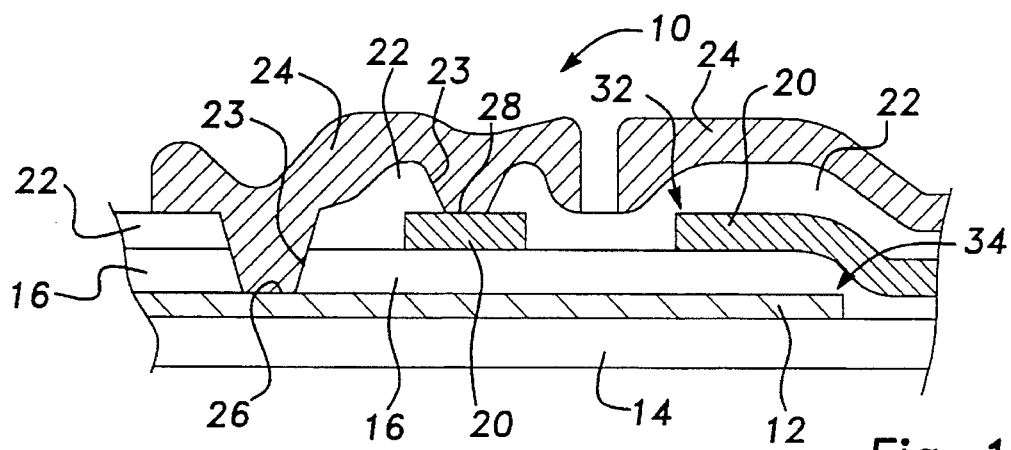
FIG. 1 illustrates a conventional superconductive multi-layered interconnect.

In FIG. 1, a superconductive multi-layered interconnect structure 10 according to the prior art is shown. A first superconducting layer (SL) 12 is deposited and patterned on a substrate 14. First dielectric layer (DL) 16 is deposited and patterned on first SL 12 and substrate 14. A second SL 20 is deposited and patterned on first DL 16. A second DL 22 is deposited and patterned on second SL 20 and first DL 16. Contact etching to create vias 23 can be performed in a conventional manner prior to depositing a third SL 24. As can be appreciated, third SL 24 is in direct contact with first SL 12 at contact 26 and with second SL 20 at contact 28.

As can be appreciated by skilled artisans, it is difficult to deposit a high quality epitaxial first DL 16 with a low dielectric constant using, the conventional method of fabricating multi-layered interconnects structure 10, especially over edges of first SL 12. Grain boundaries near the edges of first SL 12 decrease the current carrying capacity. Consequently it is similarly difficult to deposit a high quality second SL 20 on first DL 16, over edges of first SL 12 and first DL 16 due to grain boundary problems. Third SL 24 is nonplanar when third SL 24 crosses over second SL 20, for example as indicated by arrow 32. Third SL 24 is similarly nonplanar when third SL 24 crosses over patterned first SL 12 at arrow 34. Second SL 20 can similarly be nonplanar if second SL 20 crosses over patterned first SL 12.

Since second SL 20 is deposited after first DL 16 is deposited, potential pinholes in first DL 16 can cause shorts between first SL 12 and second SL 20. Second SL 20 fills the pinholes creating a contact between first SL 12 and second SL 20. Second DL 22 is deposited with similar concerns/problems such as nonplanarization, step coverage, pinholing, and lower current density over steps. As with second SL 20, it is difficult to deposit a third SL 24 having high quality due to nonplanarization step coverage, pin holing, and low current density over steps.

Figure 2A:
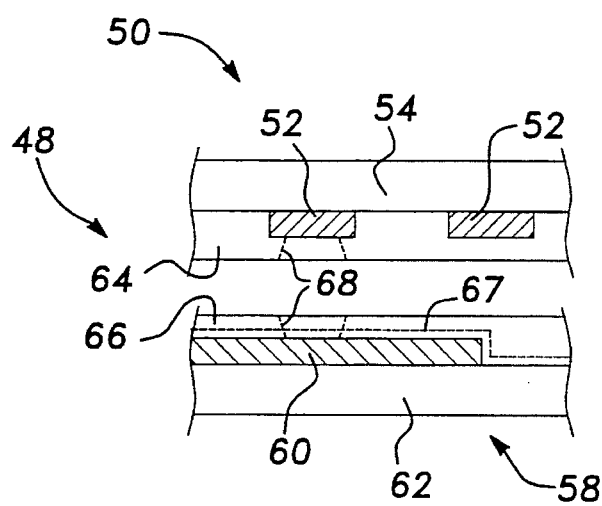
FIG. 2A illustrates first and second multi-layered substrates employed in the fabrication of a multi-layered interconnect according to the invention.
Figure 2B:
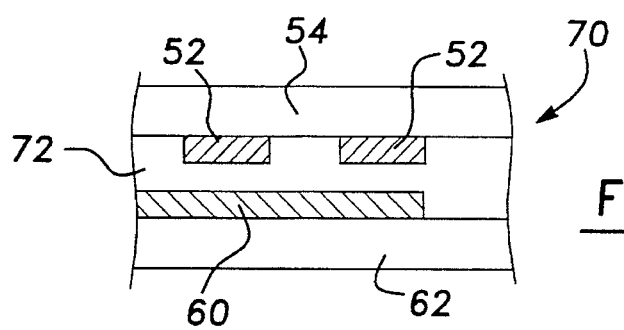
FIG. 2B illustrates the first and second multi-layered substrates of FIG. 2A after being connected together and cured to form a composite substrate.
Figure 2C:
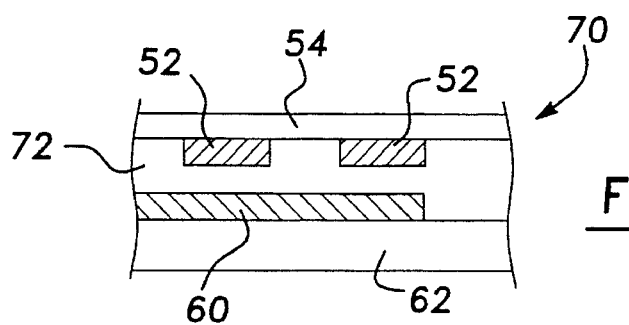
FIG. 2C illustrates lapping/polishing performed on an outer substrate of the composite substrate.
Figure 3:
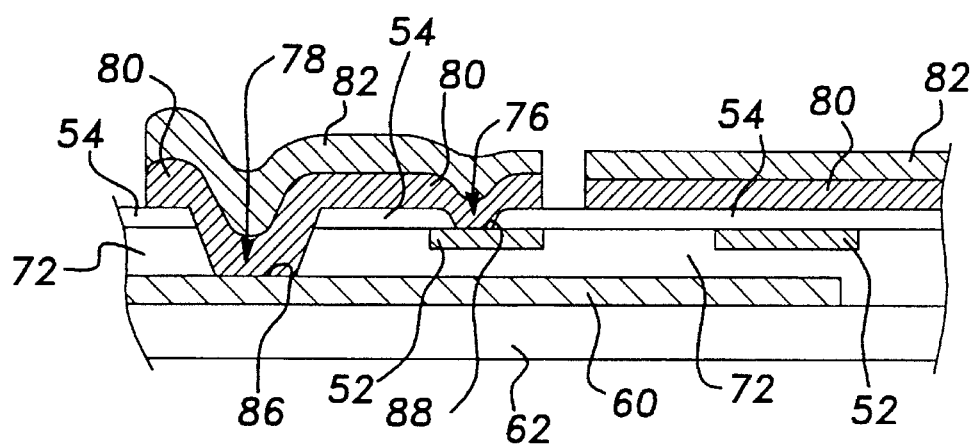
FIG. 3 illustrates the fabrication of additional interconnect layers added to the composite substrate of FIG. 2C according to a first embodiment of the invention.

Referring to FIGS. 2–3, a novel method of fabricating a multi-layered superconductive interconnect structure 48 for superconductive multi-chip-modules (MCM), printed circuit boards (PCB), and other applications according to a first embodiment of the present invention is illustrated. More specifically, referring to FIG. 2A, a first multi-layered substrate 50 is fabricated by depositing a first high temperature superconducting layer (HTSL) 52 on a substrate 54. Preferably HTSL's are made from an oxide-based superconducting material. In a more preferred embodiment, HTSL's are made of a copper-oxide-based superconducting material. In a highly preferred embodiment HTSL's comprise yttrium-barium-copper-oxygen (Y—Ba—Cu—O), bismuth-strontium-calcium-copper-oxygen (Bi—Sr—Ca—Cu—O), or thallium-barium-calcium-copper-oxygen (Tl—Ba—Ca—Cu—O). Other materials will be apparent to skilled artisans.

First HTSL 52 and other HTSL's and DL's can be patterned or unpatterned. The relative positions of multiple integrated circuits relative to each other and the number of connections therebetween will determine, in part, the patterning required. A second multi-layered substrate 58 is fabricated by depositing a second HTSL 60 on a substrate 62. Substrates 54 and 62 may be plain substrates like strontium titanate, lanthanum aluminate, magnesium oxide, neodymium gallate, or buffered substrates like yttrium stabilized zirconium buffered with cerium oxide. Still other suitable substrates will be apparent.

A first glue dielectric layer (GDL) 64 is deposited on first HTSL 52 and substrate 54. Similarly a second GDL 66 is deposited on second HTSL 60 and substrate 62. A layer of passivation dielectric (indicated by dotted lines 67) may be deposited in-situ (for example strontium titanate) or ex-situ (such as silicon nitride) to protect HTSL's 52 and 60 from the GDL's 62 and 66 during subsequent lamination. GDL's preferably have a low dielectric constant and an adhesion coefficient which allows curing at an increased temperature to provide a continuous dielectric layer. GDL's 64 and 66 can be spin-on-glass, epoxy, polyimide, benzocyclobutene (BCB), Photox, polycrystalline quartz (fused glass), or other materials that can be applied by a "resist dispense" type spin-on process, silk screening, or other similar methods.

Vias indicated by dotted lines 68 can be patterned on GDL's 64 and 66 and back-filled with a metal such as gold or silver using silk-screening, plating, bump bonding or other similar methods to connect first HTSL 52 and second HTSL 60. If one of the HTSL's is to be used as a ground plane layer, vias are most likely not required or can be provided using an additional interconnect layer as illustrated in FIG. 3. When bump bonding is employed, a layer of metal (such as gold, silver and platinum with or without an adhesion promotion layer such as titanium) is deposited using resist pattern, GDL via etch, metal deposition and lift off sequences during the via patterning process. Alternately, the layer of metal can be deposited in-situ to the HTSL before the passivation dielectric and the GDL are deposited and the via 68 holes are patterned. The substrate to be bumped is then dipped into a solder pot with or without pre-dip solder flux to grow the solder bumps. The composition of the solder is selected so that the reflow temperature of the solder is compatible with the curing temperature of the GDL during all subsequent lamination processes.

Referring to FIG. 2B, first and second multi-layered substrates 50 and 58 are aligned and connected together. GDL's 64 and 66 are cured or co-fired to laminate first and second multi-layered substrates 50 and 58 into a composite substrate 70 illustrated in FIG. 2B. Each GDL preferably has a low curing temperature. Preferably, GDL's 64 and 66 are cured at a temperature lower than 600° C. In a preferred embodiment the curing temperature is below 400° C. In a highly preferred embodiment, the curing temperature is below 200° C.

Preferably GDL's 64 and 66 have a low dielectric constant. Preferably the dielectric constant should be less than 100. In a more preferred embodiment the dielectric constant is less than 50, and in a highly preferred embodiment the dielectric constant is less than 10. The GDL's 64 and 66 preferably have thickness uniformity when spun-on and a low defect density. Preferably GDL's 64 and 66 have a high resistance to delamination. The coefficient of thermal expansion of GDL's 64 and 66 should be approximately matched to the coefficient of thermal expansion of the HTSL's 52 and 60 and substrates 54 and 62 to prevent uneven expansion which may cause quality problems, such as delamination or cracking. Some HTSL's and substrates may stretch and therefore less matching is required. Depending upon the selection of the glue dielectric, the curing/co-firing temperature and ambient or operating temperature will be different. As can be appreciated, first and second GDL 64 and 66 combine during curing to form a composite dielectric layer 72.

Referring to FIG. 2C, first substrate 54 (or alternately second substrate 62) can be thinned to a desired thickness using a lapping/polishing technique or other similar methods. Wet chemical etching or other similar surface treatment may be employed to remove surface damage caused by physical contact during clamping or by the thinning. As can be appreciated, if thinning is performed on first substrate 54 before the lamination step, significant yield reduction occurs. However, second substrate 62 provides structural support which allows thinning to be performed after lamination without attendant yield reduction.

Referring to FIG. 3, a first embodiment for adding additional HTS interconnect layers is illustrated. The first embodiment is employed if the curing temperature/ambient and the properties of the GDL's are such that the composite substrate 70 can withstand high temperatures (700°–800° C.) associated with HTSL deposition without destroying the layers of the composite substrate 70.

The composite substrate 70 is patterned for via contacts using standard etching techniques such as ion milling, reactive ion etching, wet chemical etching, or similar methods. For example, etching is performed to create one or more vias 76 and 78 in FIG. 3. Subsequently, a third HTSL 80 is deposited on composite substrate 70 and an in-situ metal layer 82, such as gold or silver, is deposited over third HTSL 80. A contact 86 between third HTSL 80 and first HTSL 60 can be provided depending on whether a floating or non-floating ground plane HTSL 60 is desired. Similarly a contact 88 between third HTSL 80 and second HTSL 52 can be provided. Third HTSL 80 can be deposited using laser ablation, sputtering, molecular beam epitaxy (MBE), metal organo chemical vapor deposition (MOCVD) or other similar techniques. Subsequently, third HTSL 80 and metal layer 82 can be patterned as desired.

In applications where only two superconducting layers (60 and 52) are required, the third HTSL 80 is eliminated and only the metal layer 82 is deposited. In such cases, the temperature constraint of requiring composite substrate 70 to withstand high temperatures (700°–800° C.) is no longer required.

Preferably, substrates 54 and 62 are epitaxial substrates. Substrates 54 and 62 are single crystals with lattice constants which closely match first HTSL 52 and second HTSL 60, respectively.

Figure 4A:
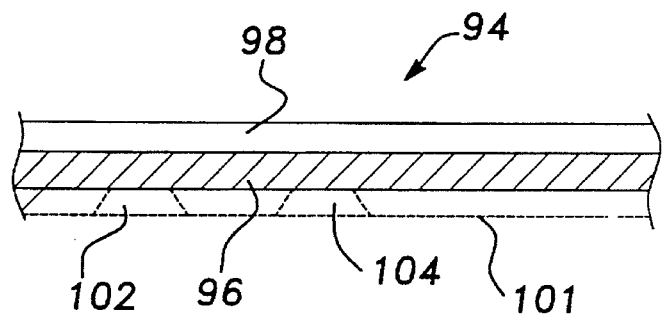
FIG. 4 illustrates the fabrication of additional interconnect layers added to the composite substrate of FIG. 2C according to a second embodiment of the invention.
Figure 4B:
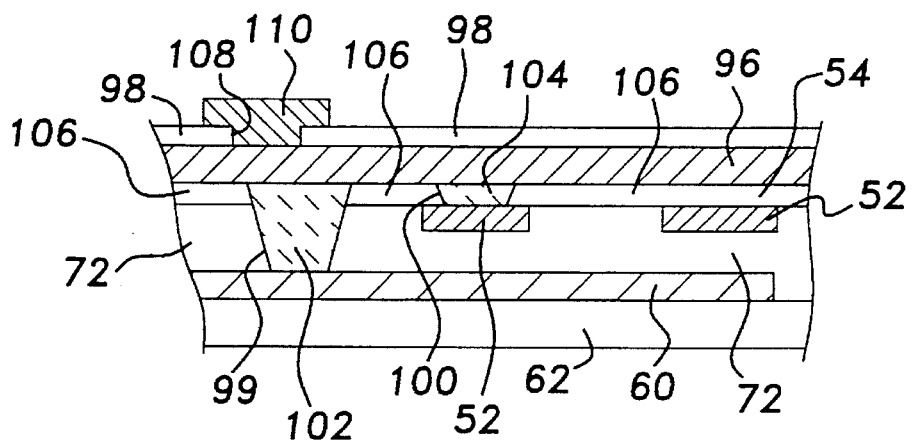

Referring to FIG. 4, a second embodiment for fabricating additional HTS interconnect layers on composite substrate 70 is illustrated. The second embodiment is employed if the curing temperature/ambient or the properties of the GDL's are such that the composite substrate 70 cannot survive high temperatures (700°–800° C.) encountered during HTSL deposition. Referring to FIGS. 4A and 4B, a third HTSL 96 is deposited on a third substrate 98. Third HTSL 96 and third substrate 98 can be patterned if desired.

Composite substrate 70 as illustrated in FIG. 2C is further processed in a manner similar to the via patterning described above in conjunction with FIG. 2A. Contact etching is performed to create first via 99 and/or second via 100 which are subsequently filled with a metal. Preferably the metal is a noble metal. A third GDL (indicated by dotted lines 101) is deposited on third 96 and/or first substrate 54 and metal filled contacts 102 and 104 are processed in a manner similar to via patterning 68 as shown in FIG. 2A. Third multi-layered substrate 94 and composite substrate 70 are aligned, connected together by curing or co-firing GDL 101. After curing, GDL 101 forms a composite dielectric 106 located between third SL 96 and composite DL 72.

Substrate 98 is subsequently thinned using a lapping/polishing technique or another similar method. Wet chemical etching or other similar surface treatment may be employed to remove surface damage caused by the lapping/polishing technique if necessary. Contact vias 108 are etched in third substrate 98 after thinning. A metal pad layer 110 is deposited in via 108. Additional layering can be added in a manner similar to the above method described in conjunction with third HTSL 96.

While the foregoing description related to interconnects employing HTSL, the method of the present invention has a similar advantage with interconnects employing low temperature superconducting layers (LTSL).

Skilled artisans can appreciate that the present invention as described significantly improves the fabrication of multilayer superconductive interconnects. The glue/lamination step and the resulting structural support of the second substrate 62 enables the first substrate 54 to be thinned to the desired thickness without suffering significant yield loss.

Skilled artisans can also appreciate that the first HTSL and second HTSL can be easily deposited on separate nondispersive, low loss, low dielectric constant DL's. First and second HTSL are insensitive to defects such as pin-holes in composite DL 72 which is formed by the cured GDL. Since first and second HTSL were already deposited before curing, pin-holes in the composite DL will not cause shorts between the first and second HTSL.

Preferably HTSL's are deposited with a thickness of 1 micron or less. Preferably GDL's have a thickness of 25 microns or less. The substrate upon which lapping is performed should have thickness of 500 microns or less. In a preferred embodiment the lapped substrates have a thickness of 100 microns or less. In a highly preferred embodiment the lapping substrates have a thickness of 25 microns or less.

The first and second HTSL are flat/planar and, therefore, current density is highly uniform and step coverage problems are minimized or eliminated. Composite DL 72 has a low dielectric constant to ensure a high impedance for efficient transmission of signals and is planarized. First substrate 54, after thinning using lapping/polishing, has a low defect density and high integrity as compared with a thin film deposited dielectric fabricated using conventional methods such as laser ablation or sputtering. First substrate 54 (after thinning) is planar and can be made of a low dielectric substrate material such as lanthanum aluminate, etc. Third HTSL is flat/planar when third HTSL crosses over second HTSL and/or first HTSL (if patterned) and as a result avoids problems associated with nonuniform current density in layers adjacent to nonplanar steps. Still other advantages will be readily apparent.

The various advantages of the present invention will become apparent to those skilled in the art after a study of the foregoing specification and following claims.

What is claimed is:

1. A method of fabricating a multi-layer superconductive interconnect structure comprising the steps of:

fabricating a first multi-layer substrate by depositing a first superconducting layer (SL) on a first epitaxial substrate and applying a first glue dielectric layer (GDL) on said first SL;

fabricating a second multi-layer substrate by depositing a second SL on a second epitaxial substrate and applying a second GDL on said second SL;

clamping said first and second multi-layer substrates together with said first GDL and said second GDL in contact; and curing said first and second GDL layers to connect first and second multi-layer substrates together to create a first composite substrate.

2. The method of fabricating the multi-layer superconductive interconnect structure of claim 1 wherein said first and second SL's are oxide-based superconducting materials.

3. The method of fabricating the multi-layer superconductive interconnect structure of claim 1 wherein said first and second SL are copper-oxide based superconducting materials.

4. The method of fabricating the multi-layer superconductive interconnect structure of claim 1 wherein said first and second SL's comprise at least one of yttrium-barium-copper-oxide, bismuth-strontium-calcium-copper-oxide, and thallium-barium-calcium-copper-oxide.

5. The method of fabricating the multi-layer superconductive interconnect structure of claim 1 wherein said first and second GDL's comprise at least one of glass, epoxy, polyimide and benzocyclobutene.

6. The method of fabricating the multi-layer superconductive interconnect structure of claim 1 further comprising the step of:

applying said first GDL to said first SL by a spin-on process.

7. The method of fabricating the multi-layer superconductive interconnect structure of claim 1 further comprising the step of:

applying said first GDL to said first SL by a silk screening process.

8. The method of fabricating the multi-layer superconductive interconnect structure of claim 1 further comprising the step of:

depositing a passivation dielectric layer on the first SL before depositing said first GDL.

9. The method of fabricating the multi-layer superconductive interconnect structure of claim 8 wherein said first SL is a high temperature SL.

10. The method of fabricating the multi-layer superconductive interconnect structure of claim 1 further comprising the step of thinning said first epitaxial substrate after the composite structure has been formed.

11. The method of fabricating the multi-layer superconductive interconnect structure of claim 10 wherein said step of thinning includes the step of lapping/polishing said first epitaxial substrate.

12. The method of fabricating the multi-layer superconductive interconnect structure of claim 11 further comprising the step of:

removing surface damage resulting from lapping/polishing said first epitaxial substrate.

13. The method of fabricating the multi-layer superconductive interconnect structure of claim 12 wherein said step of removing surface damage includes the step of wet chemical etching.

14. The method of fabricating the multi-layer superconductive interconnect structure of claim 10 further comprising the step of:

etching a via in said first epitaxial substrate to at least one of said first SL and said second SL.

15. The method of fabricating the multi-layer superconductive interconnect structure of claim 14 wherein said step of etching is performed by at least one of ion milling, reactive ion etching, and wet chemical etching.

16. The method of fabricating the multi-layer superconductive interconnect structure of claim 14 further comprising the steps of:

depositing a third SL on said first epitaxial substrate.

17. The method of fabricating the multi-layer superconductive interconnect structure of claim 16 further comprising the step of:

depositing a metal layer on said third SL.

18. The method of fabricating the multi-layer superconductive interconnect structure of claim 10 further comprising the step of:

etching a via in said first epitaxial substrate to expose said first SL; and filling said via with a metal.

19. The method of fabricating the multi-layer superconductive interconnect structure of claim 18 wherein said metal is a noble metal.

20. The method of fabricating the multi-layer superconductive interconnect structure of claim 18 further comprising the step of:

fabricating a third multi-layer substrate by depositing a third SL on a third epitaxial substrate.

21. The method of fabricating the multi-layer superconductive interconnect structure of claim 20 further comprising the step of:

depositing a third GDL on at least one of said third SL and said thinned first epitaxial substrate.

22. The method of fabricating the multi-layer superconductive interconnect structure of claim 21 further comprising the step of:

clamping said third multi-layer substrate and said composite substrate with said third GDL between said third SL and said thinned first epitaxial substrate; and curing said third GDL to connect together the third multi-layer substrate and said first composite substrate to create a second composite substrate.

23. The method of fabricating the multi-layer superconductive interconnect structure of claim 22 further comprising the step of:

thinning said third epitaxial substrate using a lapping/polishing technique.

24. The method of fabricating the multi-layer superconductive interconnect structure of claim 23 further comprising the steps of:

etching a via through said third epitaxial substrate to said third SL; and depositing metal in said via.

25. A method of fabricating a multi-layer superconductive interconnect structure comprising the steps of:

fabricating a first multi-layer substrate by depositing a first oxide-based superconducting layer (SL) on a first epitaxial substrate and applying a first glue dielectric layer (GDL) on said first SL;

fabricating a second multi-layer substrate by depositing a second oxide-based SL on a second epitaxial substrate and applying a second GDL on said second SL;

clamping said first and second multi-layer substrates together with said first GDL and said second GDL in contact; and curing said first and second multi-layer substrates to create a first composite substrate, wherein said first and second GDL comprise at least one of epoxy, polyimide, benzocyclobutene and glass.

26. A method of fabricating a multi-layer interconnect structure, said method comprising the steps of:

a) depositing a first oxide-based superconducting layer (SL) on a first epitaxial substrate;

b) applying a first glue dielectric layer (GDL) on said first superconducting layer;

c) depositing a second oxide-based superconducting layer on a second epitaxial substrate;

d) applying a second glue dielectric layer on said second superconducting layer, said first and second glue dielectric layers being selected from the group of glass, epoxy, polyimide and benzocyclobutene (BCB);

e) placing the first and second glue dielectric layers together;

f) applying heat to the glue dielectric layers to cure the glue dielectric layers and form a resultant composite multi-layer structure;

g) thinning the first epitaxial substrate;

h) forming at least one via through the first epitaxial substrate to the second superconducting layer;

i) depositing a third superconducting layer on a third substrate;

j) applying a third glue dielectric layer between the third superconducting layer and the first epitaxial substrate;

k) placing the third glue dielectric layer and first substrate together and applying heat thereto to cure the third glue dielectric layer; and l) applying at least one contact through the third substrate to contact the third superconducting layer.

* * * * *